United States Patent [19]
Choi et al.

[11] Patent Number: 6,165,840
[45] Date of Patent: Dec. 26, 2000

[54] METHOD FOR FABRICATING A DRAM CELL CAPACITOR INCLUDING FORMING FIRST MULTILAYER INSULATOR, FORMING CONDUCTIVE PLUG, FORMING SECOND INSULATOR, AND ETCHING SECOND AND FIRST INSULATORS TO FORM THE STORAGE NODE

[75] Inventors: Chang-Won Choi, Seoul; Chang-Hwan Lee, Kyunggi-do; Chul Jung, Kyunggi-do; Min-Seok Han, Kyunggi-do, all of Rep. of Korea

[73] Assignee: Samsung Electronics Co., Ltd., Rep. of Korea

[21] Appl. No.: 09/300,815

[22] Filed: Apr. 27, 1999

[30] Foreign Application Priority Data

Apr. 29, 1998 [KR] Rep. of Korea ............ 98-15302

[51] Int. Cl.[7] ............................................. H01L 21/8242
[52] U.S. Cl. ..................... 438/253; 438/255; 438/396; 438/398
[58] Field of Search ................... 438/253–256, 438/306–309, 396–399

[56] References Cited

U.S. PATENT DOCUMENTS

| 5,330,614 | 7/1994 | Ahn | 438/396 |
|---|---|---|---|
| 5,346,844 | 9/1994 | Cho et al. | 438/253 |
| 5,792,690 | 8/1998 | Sung | 438/253 |
| 5,930,623 | 7/1999 | Wu | 438/253 |
| 5,953,608 | 9/1999 | Hirota | 438/253 |

*Primary Examiner*—Charles Bowers
*Assistant Examiner*—William M. Brewster
*Attorney, Agent, or Firm*—Myers Bigel Sibley & Sajovec

[57] ABSTRACT

Disclosed is an improved method for fabricating a DRAM cell capacitor which can prevent over-etching of polysilicon storage node. The method includes the steps of etching a first insulating layer on a semiconductor substrate to form a storage contact hole, filling the storage contact hole with a first conductive material to form a storage contact plug, forming a second insulating layer over the first insulating layer including the storage contact plug, forming a mask over the second insulating layer to define a storage node region, using the mask and etching the second and first insulating layers to form an opening therein to an upper surface of the storage contact plug, and filling the opening with a second conductive material to form a storage node.

11 Claims, 5 Drawing Sheets

METHOD FOR FABRICATING A DRAM CELL CAPACITOR INCLUDING FORMING FIRST MULTILAYER INSULATOR, FORMING CONDUCTIVE PLUG, FORMING SECOND INSULATOR, AND ETCHING SECOND AND FIRST INSULATORS TO FORM THE STORAGE NODE

FIELD OF THE INVENTION

The present invention relates to a semiconductor device, and more particularly to a method for fabricating a DRAM cell capacitor which can prevent overetching of a polysilicon storage node.

BACKGROUND OF THE INVENTION

With the recent increase of integration density of a DRAM, a cell size and an area to be occupied by a capacitor of the DRAM cell tend to reduce, respectively. In order to keep a capacitance of such capacitor at an acceptable value, a stacked capacitor has been used since it can provide a large capacitor area therein and it is capable of reducing interference between DRAM cells.

FIG. 1A to FIG. 1C are flow diagrams showing the process steps of a prior art method for fabricating a DRAM cell capacitor. FIG. 1A illustrates, in cross-section, a portion of a semiconductor substrate 10 having already undergone several process steps. Briefly, a device isolation layer 12 is formed on the semiconductor substrate 10 to define active and inactive regions. A gate electrode structure 14 is formed over the semiconductor substrate 10. The gate electrode structure 14 is constituted by a gate oxide layer, a gate electrode, and a passivation layer. A source/drain region 16 is formed in the semiconductor substrate 10 adjacent to the gate electrode structure 14. An oxide layer 18 is formed over the semiconductor substrate 10 including the gate electrode structure 14. A storage contact hole 20 is opened in the oxide layer 18 to the source/drain region 16 and filled with a conductive material to form a storage contact plug 22. A polysilicon layer 24 is deposited on the contact plug 22 and over the oxide layer 18 to a thickness of about 10,000Å. A photoresist layer is spin coated over the polysilicon layer 24 and is patterned into desired configuration 26 using conventional photolithographic process.

The polysilicon layer 24 exposed by the patterned photoresist layer 26 is etched using poly etch-back process to form a storage node 24a as shown in FIG. 1B. After that, the patterned photoresist layer 26 is removed through ashing and stripping as shown in FIG. 1C.

However, the process of etching such tall as 10,000Å thick polysilicon is generally carried out under conditions that targets the etching process of 13,000Å to 15,000Å polysilicon layer. Accordingly, over-etching is inevitably performed. Due to this overetching process, the storage node 24a interfacing the oxide layer 18 and contact plug 22 are subject to over etching.

FIG. 2 is cross-sectional view of a conventional DRAM cell capacitor fabricated by above-mentioned method in case of misalignment. Referring to FIG. 2, if misalignment between the storage node 24a and the contact plug 22 occurs, bottom edges of the storage node 24a facing the contact plug 22 are severely over-etched(which is depicted as inside the dotted circle) and thereby forming a trench pit(a) which reduces contact area between the storage node 24a and contact plug 22 as shown in FIG. 2. As a result, the storage node 24a is subjected to be easily separated from underlying contact plug 22 electrically due to this trench pit(a). Furthermore, the storage node 24a is subjected to falling down during subsequent cleaning process thereby to cause short between DRAM cells.

SUMMARY OF THE INVENTION

The present invention was made in view of the above problem, and it is therefore an object of the invention to provide a method for fabricating a DRAM cell capacitor which can prevent over-etching of the storage node polysilicon.

It is another object of the invention to provide a method for fabricating a DRAM cell capacitor which can prevent the storage node from falling down.

It is yet another object of the invention to provide a method for fabricating a DRAM cell capacitor which can provide a storage node pattern stability.

To achieve these and other advantages and in accordance with the purpose of the present invention, the method begins by forming a first insulating layer composed of CVD oxide over a semiconductor substrate. As is well known in the art, a field oxide layer and a transfer transistor including a gate oxide layer, a gate electrode coated with silicon nitride layer, and a source/drain region are already formed on the semiconductor substrate before formation of this insulating layer. After planarizing the first insulating layer, a second insulating layer preferably composed of a silicon nitride layer is formed to have a thickness of about 50Å to 500Å. This silicon nitride layer subsequently serves as an etch stop layer and a barrier layer against cleaning solution during subsequent cleaning process. A third insulating layer is formed over the silicon nitride layer to have a thickness of about 1,000Å to 10,000Å. This third insulating layer is made of an oxide layer having a relatively high etch rate in wet etchant among oxide layers. For example made of PECVD(plasma enhanced chemical vapor deposition) oxide layer or HTO (high temperature oxide) layer. A storage contact hole is open in these insulating layers to the source/drain region. A conductive layer such as polysilicon is deposited in the contact hole to form a storage contact plug. A fourth insulating layer such as PECVD oxide layer is deposited to a thickness of about 5,000Å to 13,000Å. This fourth insulating layer has a thickness to that determines the height of the capacitor storage node. A photoresist layer is spin coated on the fourth insulating layer and is patterned using photolithographic technique to form an opening portion aligned over the contact plug. Using the patterned photoresist layer, the exposed fourth oxide layer(PECVD oxide layer) is anisotropically time etched to form an opening (into which subsequently polysilicon is deposited) down to the contact plug and a portion of the third insulating layer outside of the contact plug. At this time etching process, the third insulating layer(PECVD oxide layer or HTO oxide layer) serves to provide etching margin. Furthermore, even if this third insulating layer sufficiently does not play its roles, the underlying second insulating layer(silicon nitride layer) serves as an etch stop layer. A second conductive layer such as polysilicon is deposited into the opening(PECVD oxide frame) and planarized. After that, the PECVD oxide frame is removed by wet or dry etch process and thereby to form a storage node.

In accordance with this invention, the over-etching of the polysilicon can be avoided. Basically the over-etching of the polysilicon is not encountered in this method due to its inherent process sequence. Therefore, the problems encountered in the prior art, i.e., trench pit is inherently avoided even in the case of the misalignment between the contact plug and the storage node body.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

The preferred embodiment of the present invention will now be described with reference to the accompanying drawings. The present invention relates to a method for fabricating a DRAM cell capacitor. The process for forming the field oxide layer, i.e., device isolation layer, and the transistor structure as presently practiced in manufacturing DRAM cells are only briefly described in order to better understand the current invention.

Figure 1A:
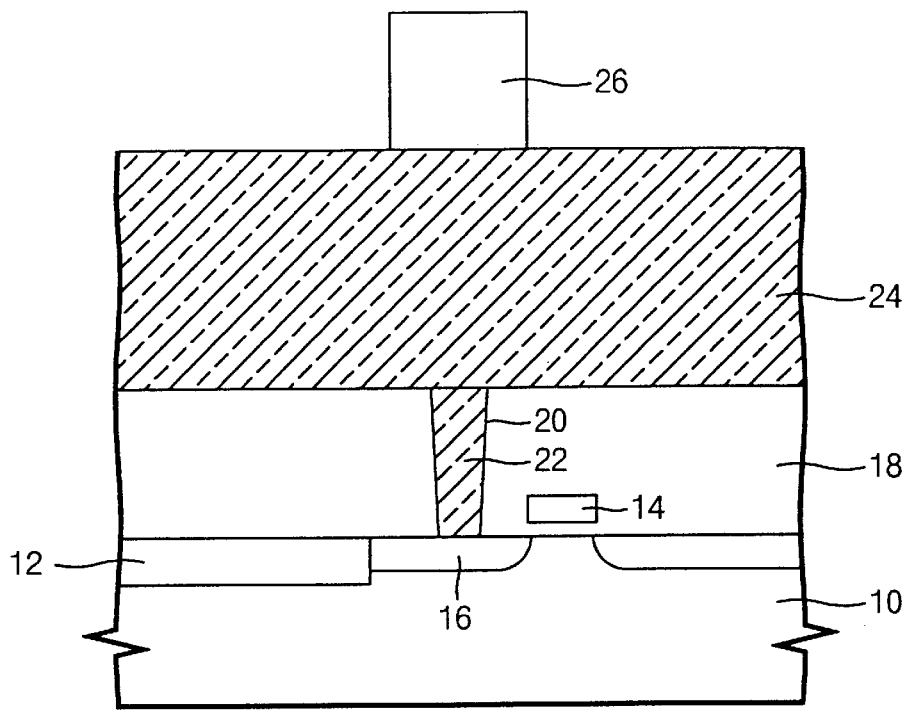
FIG. 1A to FIG. 1C are flow diagrams showing the process steps of a prior art method for fabricating a DRAM cell capacitor.
Figure 1B:
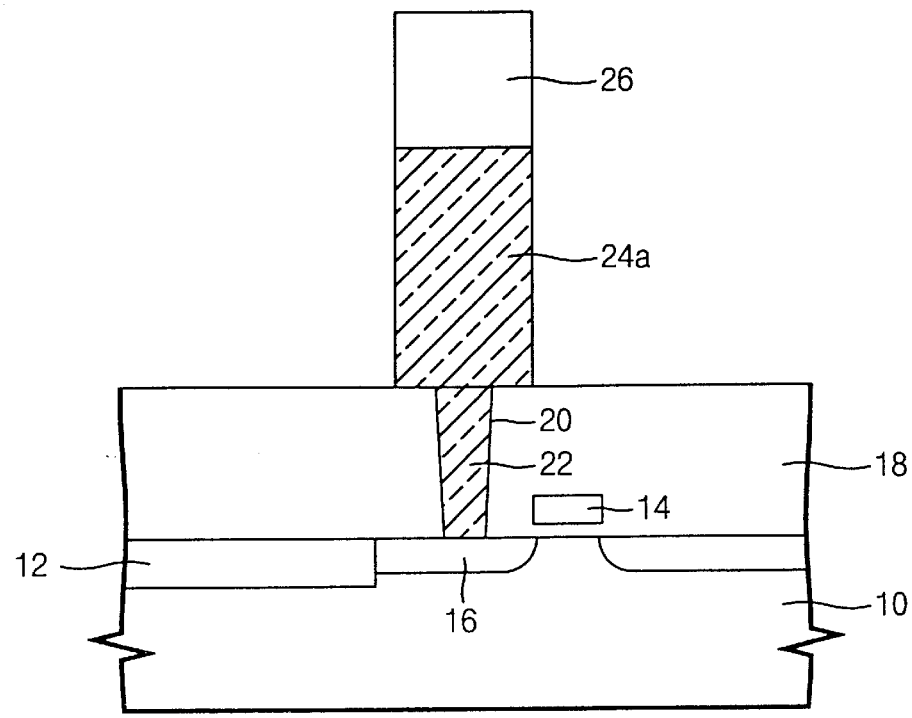
Figure 1C:
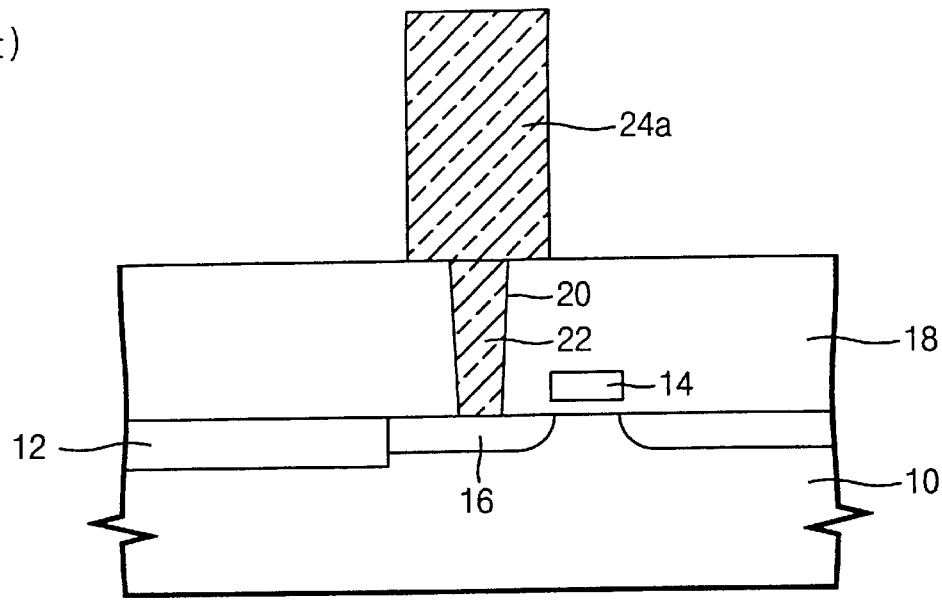
Figure 2:
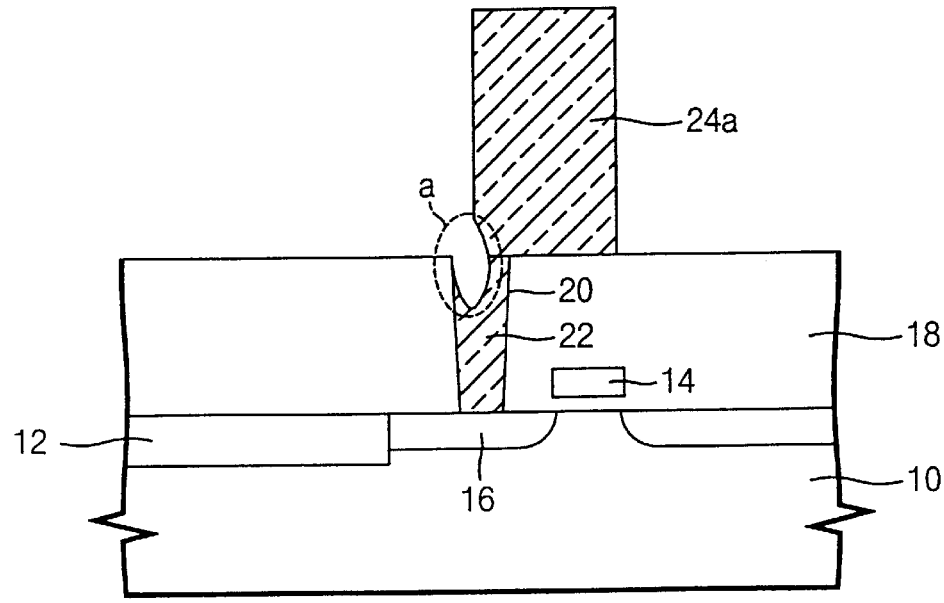
FIG. 2 is a cross-sectional view of a conventional DRAM cell capacitor fabricated by the prior art method depicted in FIG. 1A to FIG. 1C, in case of misalignment between storage contact plug and storage node.
Figure 3A:
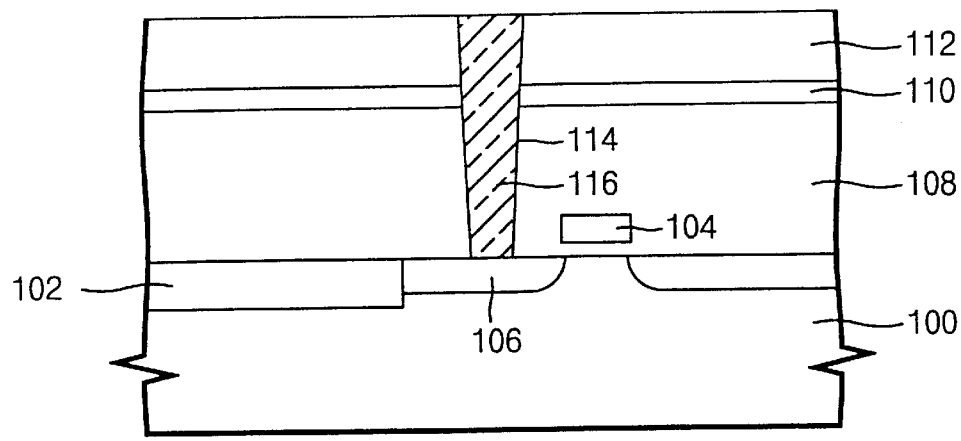
FIG. 3A to FIG. 3E are flow diagrams showing the process steps of a novel method for fabricating a DRAM cell capacitor according to an embodiment of the present invention.

FIG. 3A illustrates, in cross-section, aportion of a semiconductor substrate 100 having already undergone several process steps in accordance with one embodiment of the invention. A plurality of device isolation layers are formed at a predetermined region of the semiconductor substrate 100 to define active and inactive regions. To simplify the description and the drawings, only one device isolation layer 102 is shown in drawings. The device isolation layer 102 is formed by well-known techniques such as local oxidation of silicon or trench isolation technique. A plurality of field effect transistors are formed on the active region of the semiconductor substrate 100. For the shake of simplicity, only one transistor 104 is depicted in drawings. The transistor 104 includes a gate oxide layer(not shown), a gate electrode with a silicon nitride mask and sidewall spacer, and a source/drain region 106 aligned with the sidewall spacer. A first insulating layer 108 is formed over the semiconductor substrate 100 including the transistor 104. The first insulating layer 108 is made of an oxide layer by CVD technique. After planarizing the first insulating layer 108 using CMP or etch-back technique, a second insulating layer 110 preferably composed of a silicon nitride layer is formed to have a thickness of about 50Å to 500Å. This silicon nitride layer 110 subsequently serves as an etch stop layer and a barrier layer against cleaning solution during cleaning process. A third insulating layer 112 is formed over the silicon nitride layer 110 to have a thickness of about 1,000Å to 10,000Å. This third insulating layer 112 is made of an oxide layer having a relatively high etch rate in wet etchant among oxide layers. For example, made of PECVD (plasma enhanced chemical vapor deposition) oxide layer or HTO(high temperature oxide) layer. As will be described later, this oxide layer 112 serves to provide time margin(i.e., etching margin) during time etching of subsequent thick fourth insulating layer 118. A storage contact hole 114 is opened in these insulating layers 112, 110, and 108 to the source/drain region 106. A conductive layer such as polysilicon is deposited in the contact hole 114 to form a storage contact plug 116. A fourth insulating layer 118, called sacrificing layer, such as PECVD oxide layer is deposited to a thickness of about 5,000Å to 13,000Å. This fourth insulating layer 118 has a thickness to that determines the height of the capacitor storage node which directly relates to the capacitance of the capacitor.

Figure 3B:
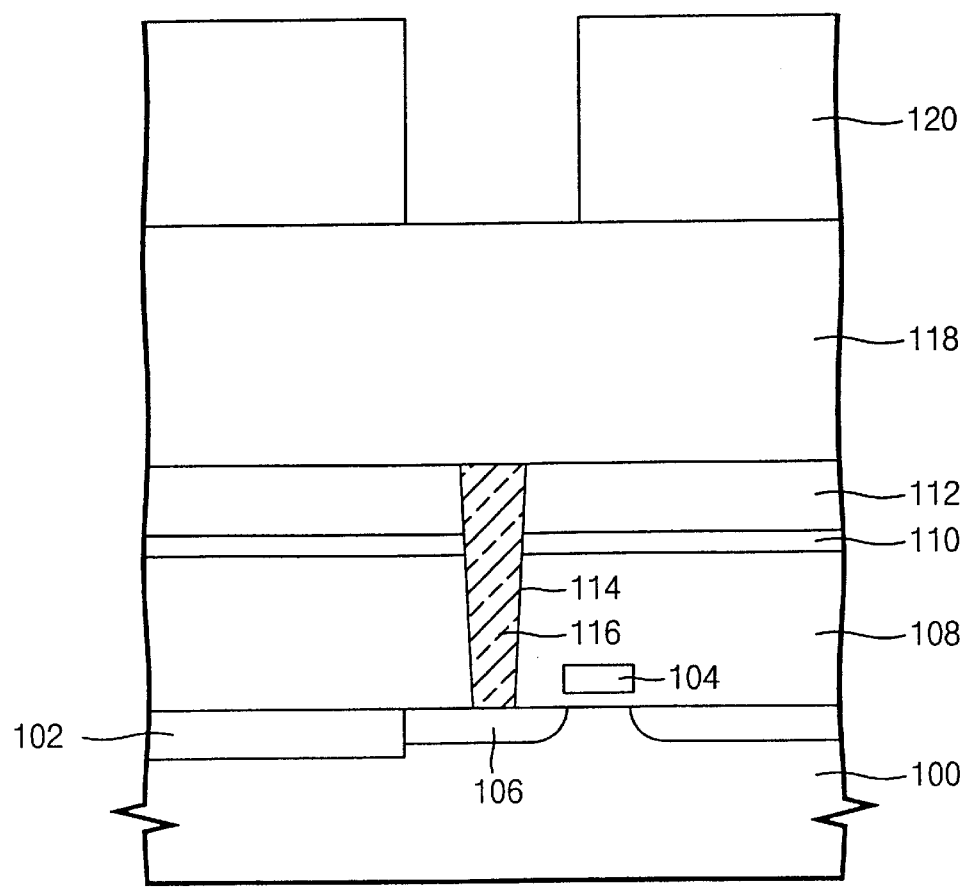
Figure 3C:
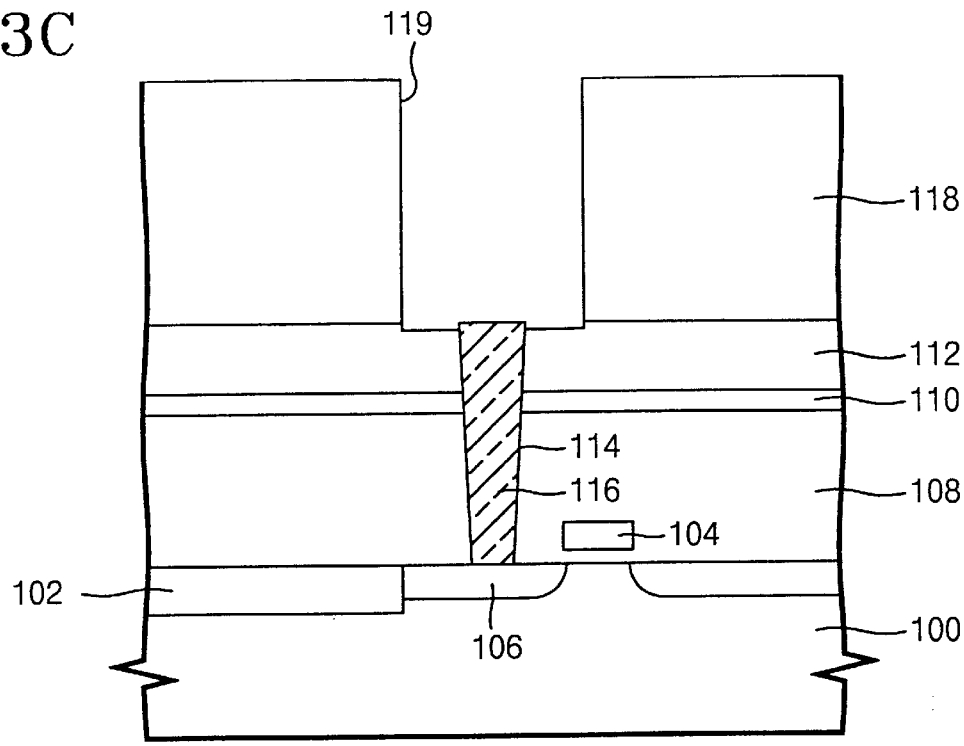

Referring to FIG. 3B, a photoresist layer is spin coated on the fourth insulating layer 118 and is patterned using photolithographic technique into predetermined configuration having an opening portion aligned over contact plug 116. Using the patterned photoresist layer 120, called a reversal type photoresist pattern, the exposed sacrificial oxide layer 118 is anisotropically time-etched to form an opening 119, i.e., PECVD oxide frame (into which subsequently polysilicon is deposited down) to the contact plug 116 and a portion of third insulating layer 112 outsides of the contact plug 116 as shown in FIG. 3C. During this time etching process of such 5,000Å to 13,000Å thick sacrificing layer 118, the third insulating layer 112 serves to provide time margin, i.e., etching margin. Furthermore, even if this third insulating layer 112 etched away completely, the underlying second insulating layer 110 (silicon nitride layer) serves as an etch stop layer. In accordance with this embodiment, during time-etching of the sacrificing oxide layer 118, a portion of third insulating layer 112 is etched about 1000Å to 2,000Å. The patterned photoresist layer 120 is removed by ashing and stripping.

Figure 3D:
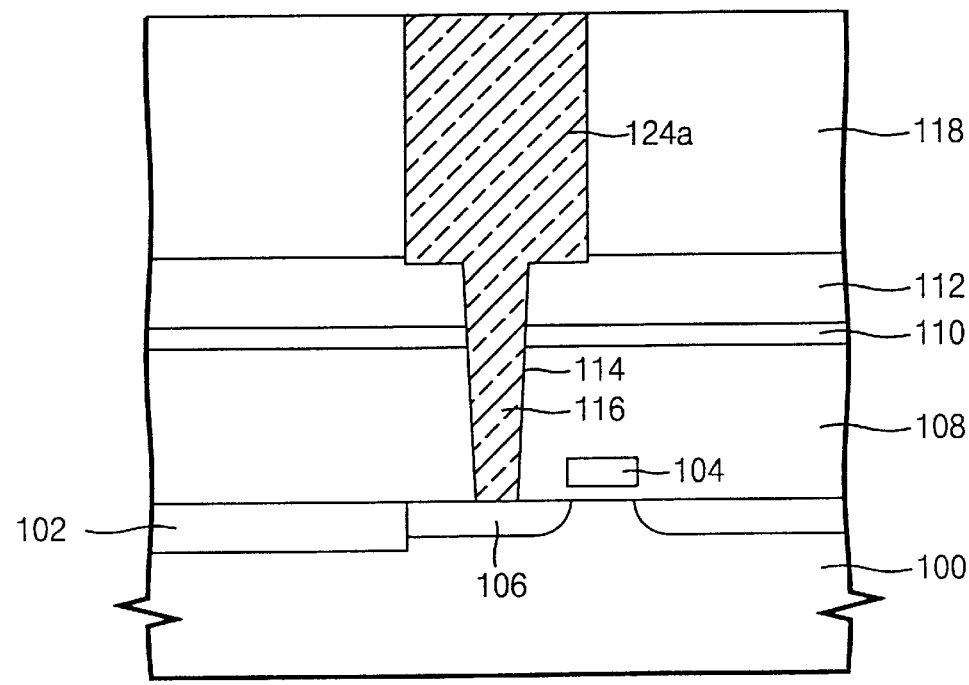

Referring to FIG. 3D, a second conductive layer such as polysilicon is deposited into the opening 119 and over the fourth oxide layer 118, and then planarized using CMP or etch-back technique down to an upper surface of the sacrificing oxide layer 118, thereby forming a storage node 124a. Etch-back of the polysilicon layer uses mixed gas containing carbon and fluorine such as $CF_4$, $C_2H_6$, $C_3H_8$, $C_4H_8$, $CH_2F_6$, $CH_3F$, $CHF_3$, and $SF_6$.

Figure 3E:
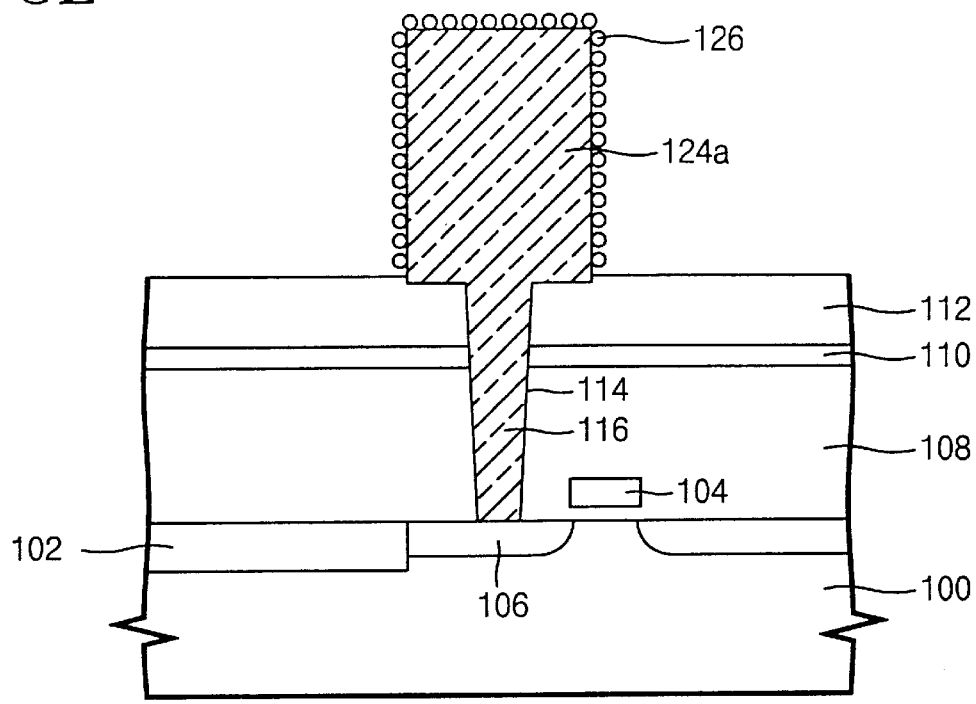

Referring to FIG. 3E, the sacrificing oxide layer 118 is removed by wet etching or dry etching. In accordance with this invention, the over-etching of the polysilicon is avoided. Basically the over-etching of the 10,000Å polysilicon is not encountered in this novel method due to its inherent process sequence. Therefore, the problems encountered in the prior art, i.e., trench pit is inherently avoided even in the case of the misalignment between the contact plug 116 and the storage node body 124a as shown in FIG. 4.

In order to increase the surface areas of the storage node 124a, a rough surface layer such as hemispherical grain (HSG) silicon layer 126 may be formed on the surface of the storage node. A dielectric layer(not shown) and top electrode (not shown) are deposited to completely form the capacitor. A fifth insulating layer(not shown) is formed over the entire semiconductor substrate 100.

Figure 4:
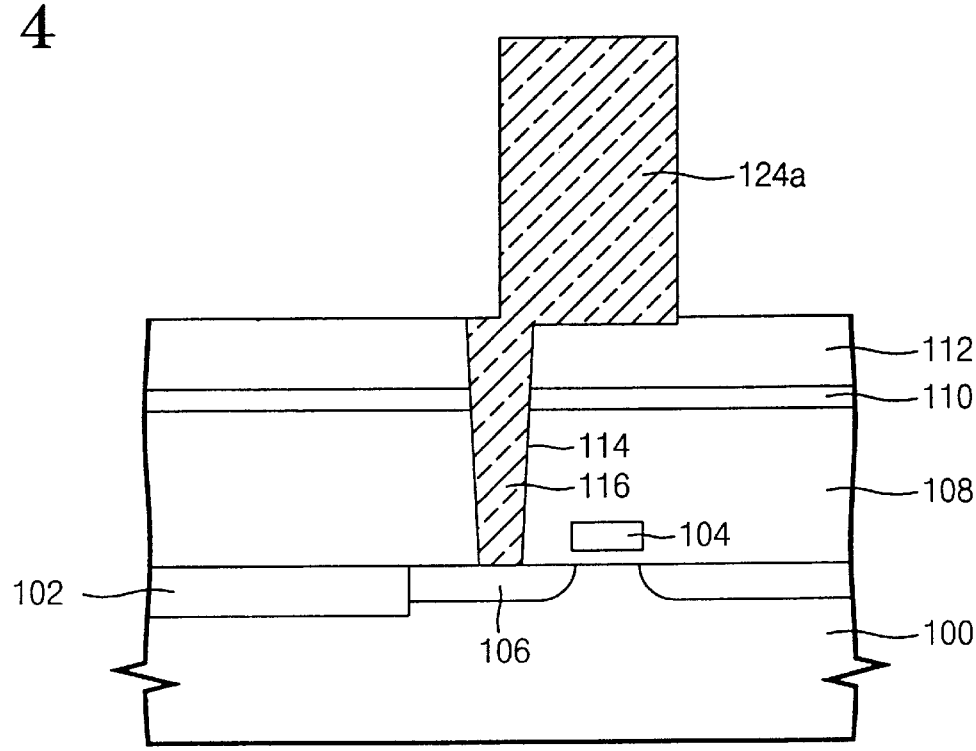
FIG. 4 is a cross-sectional view of a DRAM cell capacitor according to the embodiment of the present invention, in case of misalignment.

This invention provides a DRAM cell capacitor with greater capacitance per unit area without trench pit even in the presence of misalignment between contact plug and storage node as shown in FIG. 4.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a DRAM cell capacitor comprising the steps of:

etching a first insulating layer on a semiconductor substrate to form a storage contact hole;

filling said storage contact hole with a first conductive material to form a storage contact plug;

forming a second insulating layer over said first insulating layer including said storage contact plug;

forming a mask over said second insulating layer to define a storage node region;

using said mask and etching said second and first insulating layers to form an opening therein to an upper surface of said storage contact plug; and filling said opening with a second conductive material to form a storage node.

2. The method according to claim 1, wherein said first insulating layer is made of multi-layer film composed of an oxide layer, a silicon nitride layer and a plasma enhanced chemical vapor deposition(PECVD) oxide layer in this order.

3. The method according to claim 1, wherein said first insulating layer is made of multi-layer film composed of an oxide layer, a silicon nitride layer and a high temperature oxide(HTO) layer in this order.

4. The method according to claim 2 or 3, wherein said silicon nitride layer has a thickness of about 50 Å to 500 Å.

5. The method according to claim 2, wherein said PECVD oxide layer has a thickness of about 100 Å to 1,000 Å.

6. The method according to claim 3, wherein said HTO layer has a thickness of about 100 Å to 1,000 Å.

7. The method according to claim 1, wherein said second insulating layer comprises an oxide layer formed by PECVD method.

8. The method according to claim 1, wherein said second insulating layer has a thickness of about 5,000 Å to 13,000 Å.

9. The method according to claim 1, further comprising, after forming said storage node, removing said second insulating layer and forming a rough surface layer on an exposed portion of said storage node.

10. The method according to claim 9, wherein said step of removing said second insulating layer is performed by wet etch or dry etch process.

11. The method according to claim 9, wherein said step of forming said rough surface layer comprises growing an HSG layer.

* * * * *